(12) United States Patent
Hsu

(10) Patent No.: US 7,038,292 B2
(45) Date of Patent: May 2, 2006

(54) SUBSTRATE ISOLATION DESIGN

(75) Inventor: Tsun-Lai Hsu, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/711,036

(22) Filed: Aug. 19, 2004

(65) Prior Publication Data

US 2006/0038271 A1 Feb. 23, 20065

(51) Int. Cl.
*H01L 29/00* (2006.01)

(52) U.S. Cl. ........................ 257/510; 257/506

(58) Field of Classification Search ............... 257/506, 257/510, 509, 501, 524, 544
See application file for complete search history.

(56) References Cited

U.S. PATENT DOCUMENTS 6,831,346 B1 * 12/2004 Li et al. ................... 257/499
2003/0197242 A1 * 10/2003 Chen et al. .............. 257/509

* cited by examiner

*Primary Examiner*—Douglas W Owens
(74) *Attorney, Agent, or Firm*—Winston Hsu

(57) ABSTRACT

A substrate isolation design includes a P substrate, a P well positioned on the P substrate, at least a device positioned in the P well, and at least a P substrate guard ring surrounding the device. A P+ guard ring, an N well guard ring, or a deep N well guard ring can be selectively interposed between the P substrate guard ring and the device to facilitate blocking substrate coupling effect.

17 Claims, 12 Drawing Sheets

SUBSTRATE ISOLATION DESIGN

BACKGROUND OF INVENTION

1. Field of the Invention

The present invention relates to a substrate isolation design, and more particularly, to a substrate noise isolation design for isolating a P+ receiver from a P+ noise source.

2. Description of the Prior Art

Continuous scaling of CMOS technology has resulted in chips operating at ever-higher frequencies with analog and digital circuits residing in the same chip at ever-closer distances under realization of SOC (System On a Chip). Substrate noise coupling is an effect that no longer be ignored for SOC implementation involving circuit blocks that operate at frequencies near or above GHz level. The noise coupling via the substrate will impact the normal functioning of mixed-signal/RF circuits or digital circuits. The substrate noise can couple into signal through metal routing, device junction, or substrate. The major factors that affect the strength of this coupling are the frequency of operation, the separation distances between the circuit blocks, and the isolation schemes.

Please refer to FIG. 1 and FIG. 2. FIG. 1 and FIG. 2 are schematic diagrams of a conventional substrate structure without substrate isolation design. As shown in FIG. 1, a substrate 10 includes a P well 12, a receiver 14, a noise source 16, and a plurality of isolation structures 18 positioned on the P well 12 for preventing surface leakage currents among different devices. The substrate 10 can be a P substrate, the receiver 14 and the noise source 16 can be P+ doping regions, and the isolation structures 18 can be shallow trench isolation structures or field oxide layers.

The isolation structure 18 is formed on the surface of the P well 12 and interposed between the receiver 14 and the noise source 16, however, it is not effective in suppressing the substrate coupling effect particularly in high-frequency circuits. Industry has proposed or attempted to overcome this limitation with use of a guard ring formed around the receiver 14. A conventional guard ring is often formed by selectively placing certain dopants around the receiver 14, such as a P+ guard ring or an N well guard ring. In order to increase the reliability of the substrate isolation, multiple guard rings may be interposed between the receiver 14 and the noise source 16. Since extra photolithographic masking steps and critical mask alignment steps are required to form these guard rings, and each of which adds manufacturing time and expense as well as provides possible sources of device defects, it is desirable to provide an ideal substrate isolation design without adding masking steps.

SUMMARY OF INVENTION

It is therefore an object of the claimed invention to provide a substrate isolation design to solve the above-mentioned problems.

According to the claimed invention, the substrate isolation design includes a P substrate, a P well positioned on the P substrate, at least a device positioned in the P well, and at least a P substrate guard ring surrounding the device.

In an alternative embodiment, a P+ guard ring, an N well guard ring, or a deep N well guard ring can be selectively interposed between the P substrate guard ring and the device to facilitate blocking substrate coupling effect and improve the reliability of the substrate isolation design.

It is an advantage of the present invention that the P substrate guard ring is provided to isolate the device from other noise sources by using standard process flow of forming the device without adding extra masks. Therefore, problems such as increasing manufacturing time, steps, expense, and alignment mistakes as happened in the prior art method of forming an extra guard ring can be prevented.

These and other objects of the claimed invention will be apparent to those of ordinary skill in the art after reading the following detailed description of the preferred embodiment that is illustrated in the various figures and drawings.

DETAILED DESCRIPTION

Figure 1:
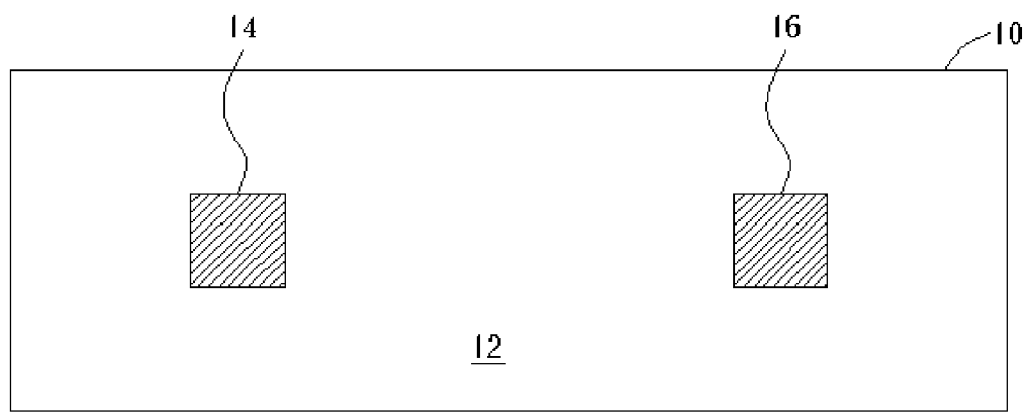
FIG. 1 and FIG. 2 are schematic diagrams of a conventional substrate structure without substrate isolation design.
Figure 2:
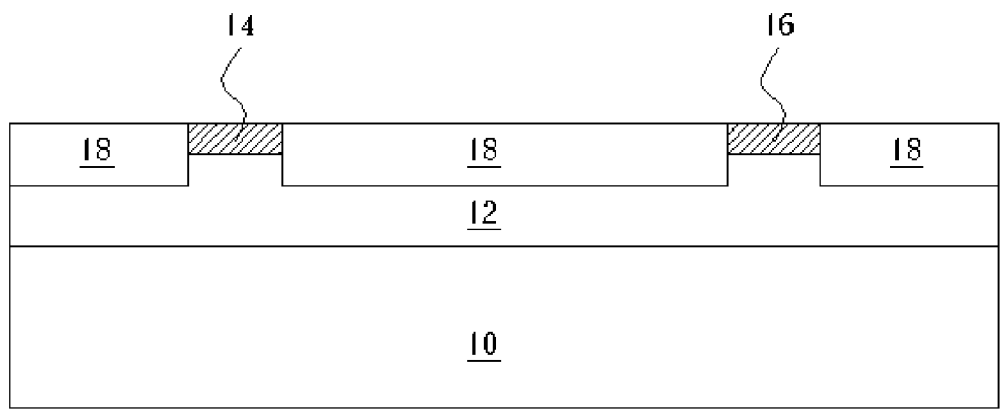
Figure 3:
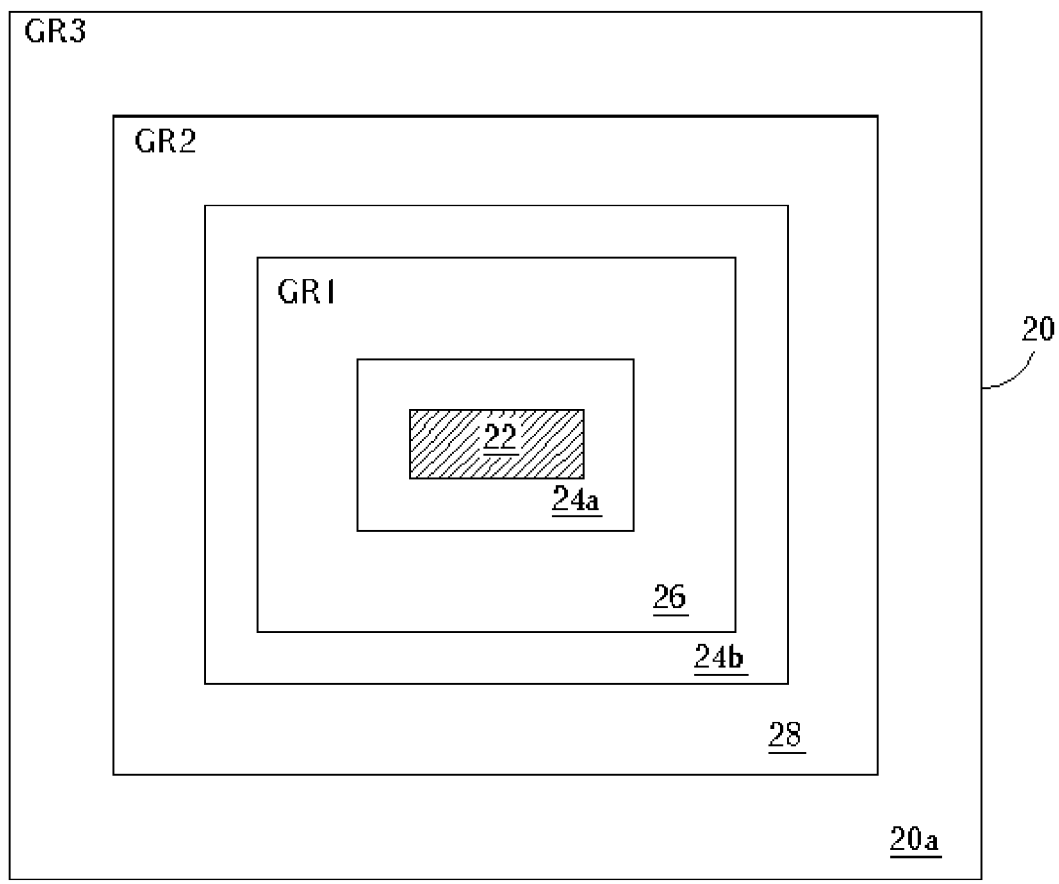
FIG. 3 is a schematic top view of a substrate isolation design having three guard rings surrounding a device according to the present invention.
Figure 4:
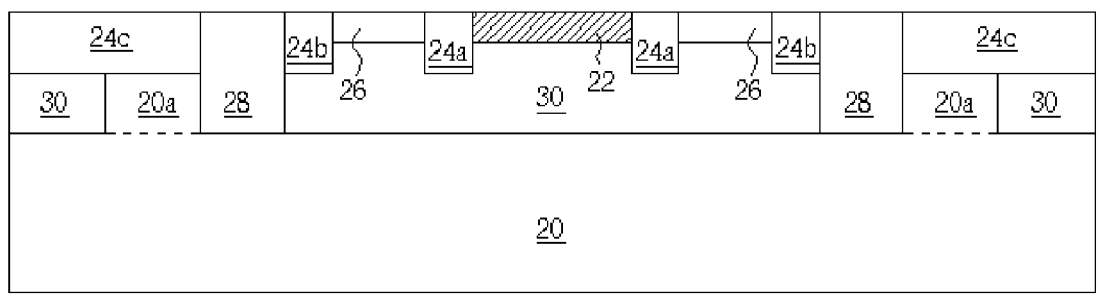
FIG. 4 is a schematic cross-sectional view of the substrate isolation design shown in FIG. 3 according to the present invention.

Please refer to FIG. 3. FIG. 3 is a schematic top view of a substrate isolation design having three guard rings surrounding a device according to the present invention. As shown in FIG. 3, a device 22 is formed on a substrate 20 and surrounded by an isolation structure 24a, a first guard ring (GR1) 26, an isolation structure 24b, a second guard ring (GR2) 28, and a third guard ring (GR3) 20a, respectively. Referring to FIG. 4, FIG. 4 is schematic cross-sectional view of the substrate isolation design shown in FIG. 3 according to the present invention. As shown in FIG. 4, the substrate 20 can be a P substrate and has a P well 30 formed thereon. The device 22 can be a P+ doping region formed in the P well 30, and the isolation structures 24a, 24b, and 24c can be shallow trench isolation structures or field oxide layers formed within the P well 30.

In a better embodiment of the present invention, the first guard ring 26 (the most inner guard ring) is a P+ guard ring 26 formed by doping the portion of the P well 30 between the isolation structures 24a and 24b. The second guard ring 28 is an N well guard ring formed by doping the portion of the substrate 20 between the isolation structures 24b and 24c. The third guard ring 20a (the outer guard ring) is a P substrate guard ring positioned beneath the isolation structure 24c and between the N well guard ring 28 and the P well 30. The P substrate guard ring 20a is a portion of the P substrate 20, and an extra doping process for forming the P substrate guard ring 20a is therefore unnecessary.

Figure 5:
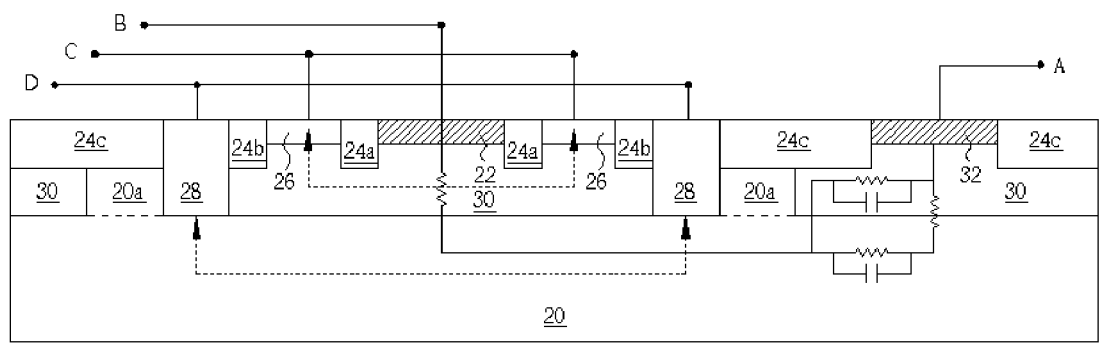
FIG. 5 depicts an equivalent circuit of the substrate isolation design shown in FIG. 3 according to the present invention.

Please refer to FIG. 5. FIG. 5 depicts an equivalent circuit of the substrate isolation design shown in FIG. 3 according to the present invention. As shown in FIG. 5, a substrate coupling and flowing path between the device 22 and an adjacent device 32 is depicted in a solid line, and filter substrate coupling paths provided by the P+ guard ring 26 and the N well guard ring 28 are depicted in dash lines. The three guard rings 26, 28 and 20a are positioned between the device 22 and the device 32. When the device 22 is considered as a receiver, the other device 32 is considered as a noise source. In this case, the device 32 is connected to a noise source A, the device 22 is connected to a receiver B, the P+ guard ring 26 is connected to ground C, and the N well guard ring 28 is connected to a power D. The noise signal traveling from the device 32 is filtered off through the substrate coupling paths provided by the P+ guard ring 26 and the N well guard ring 28. Alternatively, the device 22 can be considered as a noise source, and the guard rings 26, 28 and 20a surrounding the device 22 can be used to filter off the noise signal from the device 22 and prevents the noise signal from transmitting to disturb the device 32, which is considered as a receiver in this case.

Figure 6:
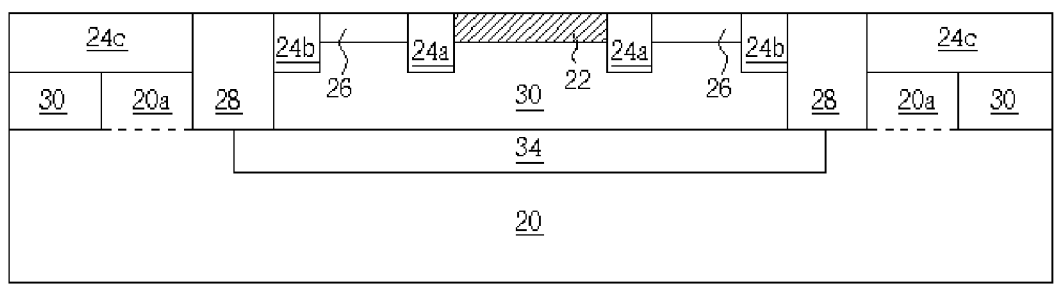
FIGS. 6–12 are schematic cross-sectional views of several embodiments of a substrate isolation design according to the present invention.

Please refer to FIGS. 6–12. FIGS. 6–12 are schematic cross-sectional views of several other embodiments of a substrate isolation design according to the present invention. As shown in FIG. 6, a new substrate isolation design introduces a deep N well guard ring 34 into the substrate isolation design as depicted in FIGS. 3 and 4. The new substrate isolation design of this embodiment includes the device 22 formed on the substrate 20 and surrounded by the isolation structure 24a, the P+ guard ring 26, the isolation structure 24b, the N well guard ring 28, and the P substrate guard ring 20a, respectively. The substrate isolation design further includes the deep N well guard ring 34 formed beneath the P well 30 to contact to the N well guard ring 28. At an appropriate operating frequency, for example an operating frequency below 2 GHz is preferred, the isolation design having the triple-well guard rings 26, 28, 34 and the substrate guard ring 20a is capable of providing better isolation performance in suppressing the substrate coupling effect than the isolation design without the deep N well guard ring 34.

Figure 7:
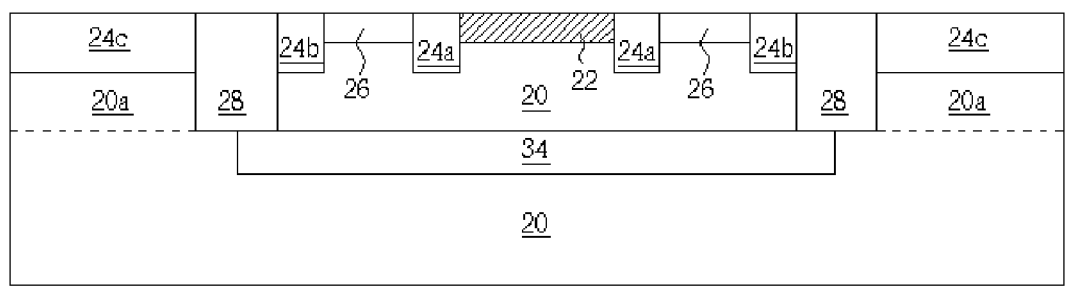

As shown in FIG. 7, a new substrate isolation design is provided, which includes the device 22 formed on the substrate 20 and surrounded by the isolation structure 24a, the P+ guard ring 26, the isolation structure 24b, the N well guard ring 28, and the P substrate guard ring 20a, respectively. In comparison with the substrate isolation design depicted in FIG. 6, the region for forming the P well 30 is occupied by the P substrate 20 according to this embodiment. It is believed that the P substrate 20 with higher sheet resistance compared to the P well 30 gives a smaller sidewall junction capacitance to suppress the substrate coupling effect.

Figure 8:
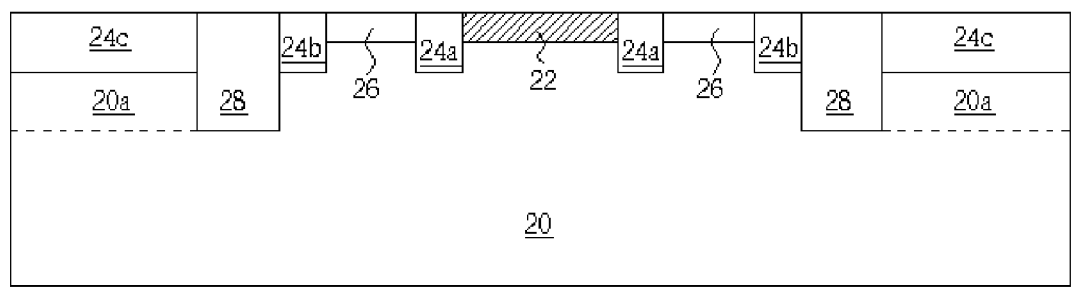

As shown in FIG. 8, a new substrate isolation design is provided, which includes the device 22 formed on the substrate 20 and surrounded by the isolation structure 24a, the P+ guard ring 26, the isolation structure 24b, the N well guard ring 28, and the P substrate guard ring 20a, respectively. In comparison with the substrate isolation design depicted in FIG. 7, the deep N well guard ring 34 can be omitted according to this embodiment.

Figure 9:
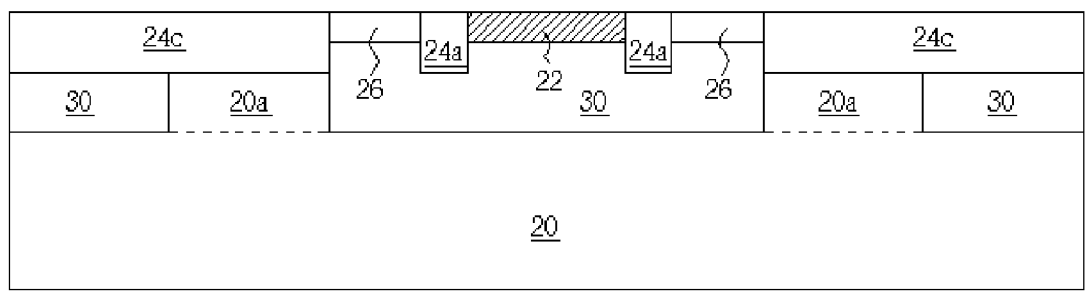

As shown in FIG. 9, a new substrate isolation design is provided, which includes the device 22 formed on the substrate 20 and surrounded by the isolation structure 24a, the P+ guard ring 26, and the P substrate guard ring 20a, respectively. In comparison with the substrate isolation design depicted in FIGS. 3 and 4, the N well guard ring 28 and the isolation structure 24b positioned between the N well guard ring 28 and the P substrate guard ring 20a can be omitted according to this embodiment.

Figure 10:
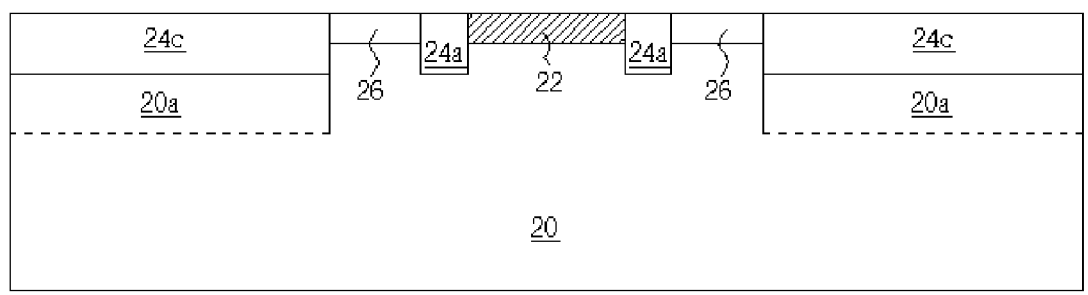

As shown in FIG. 10, a new substrate isolation design is provided, which includes the device 22 formed on the substrate 20 and surrounded by the isolation structure 24a, the P+ guard ring 26, and the P substrate guard ring 20a, respectively. In comparison with the substrate isolation design depicted in FIG. 9, the region for forming the P well 30 is occupied by the P substrate 20 according to this embodiment.

Figure 11:
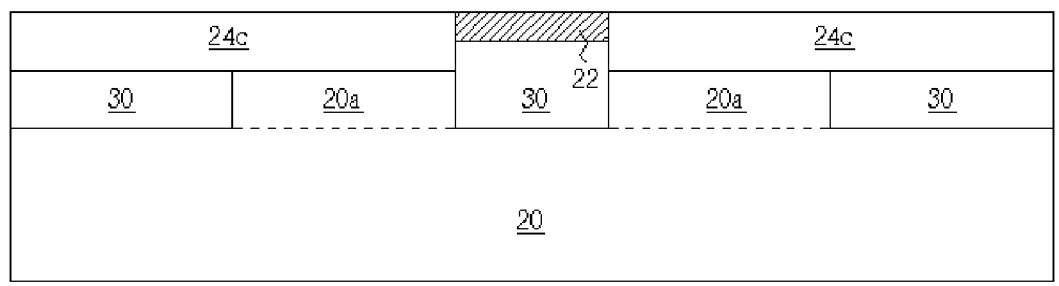

As shown in FIG. 11, a new substrate isolation design is provided, which includes the device 22 formed on the substrate 20 and surrounded by the P substrate guard ring 20a. In comparison with the substrate isolation design depicted in FIGS. 3 and 4, the isolation structure 24a, the P+ guard ring 26, the isolation structure 24b, and the N well guard ring 28 can be omitted according to this embodiment.

Figure 12:
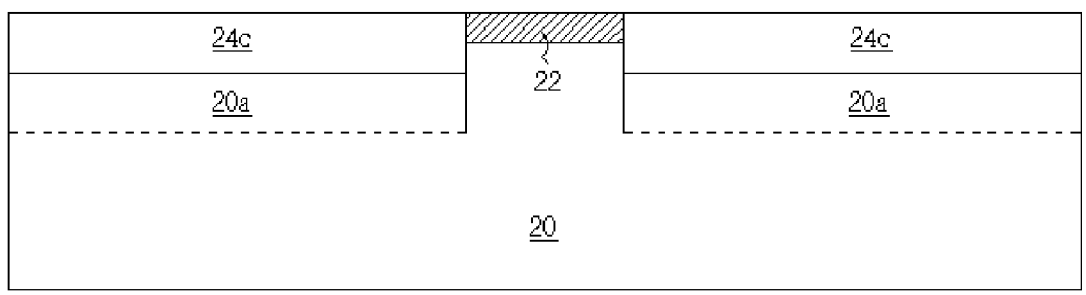

As shown in FIG. 12, a new substrate isolation design is provided, which includes the device 22 formed on the substrate 20 and surrounded by the P substrate guard ring 20a. In comparison with the substrate isolation design depicted in FIG. 11, the region for forming the P well 30 is occupied by the P substrate 20 according to this embodiment.

There are still other embodiments of combining any of the P+ guard ring, the N well guard ring, the deep N well guard ring or other guard rings together with the P substrate guard ring according to the present invention to provide better substrate isolation. For example, the P+guard ring can be omitted and the N well guard ring can be selectively interposed between the P substrate guard ring and the receiver/noise source to facilitate blocking substrate coupling effect and improve the reliability of the substrate isolation design.

In contrast to the prior art, the present invention utilizes the substrate to provide a substrate guard ring to improve the reliability of the substrate isolation. Since the substrate guard ring is a portion of the substrate, it is not required to add an extra doping process for forming the substrate guard ring according to the present invention.

Those skilled in the art will readily observe that numerous modifications and alterations of the design may be made while retaining the teachings of the invention. Accordingly, the above disclosure should be construed as limited only by the metes and bounds of the appended claims.

What is claimed is:

1. A substrate isolation design, comprising:
   a P substrate;
   a P well positioned on the substrate;
   at least a device positioned in the P well;
   at least a P substrate guard ring surrounding the device; and
   an N well guard ring positioned between the device and the P substrate guard ring,
   wherein the P substrate guard ring is positioned beneath a shallow isolation trench formed within the P well.

2. The substrate isolation design of claim 1, further comprising at least a P+ guard ring surrounding the device.

3. The substrate isolation design of claim 2, wherein the P+ guard ring is between the device and the P substrate guard ring.

4. The substrate isolation design of claim 3, wherein the N well guard ring is positioned between the P+ guard ring and the P substrate guard ring.

5. The substrate isolation design of claim 4, further comprising at least a deep N well guard ring positioned beneath the P well to contact to the N well guard ring.

6. The substrate isolation design of claim 1, wherein the N well guard ring surrounds the device.

7. The substrate isolation design of claim 6, wherein the N well guard ring is between the device and the P substrate guard ring.

8. The substrate isolation design of claim 7, further comprising at least a deep N well guard ring positioned beneath the P well to contact to the N well guard ring.

9. A substrate isolation design, comprising:
a substrate;
at least a device positioned on the substrate;
a first guard ring surrounding the device;
a second guard ring surrounding the first guard ring; and
a third guard ring surrounding the second guard ring, the third guard ring being a substrate guard ring, wherein the second guard ring comprises an N well guard ring and the substrate guard ring is positioned beneath a shallow isolation trench.

10. The substrate isolation design of claim 9, wherein the first guard ring comprises a P+ guard ring.

11. The substrate isolation design of claim 9, wherein the third guard ring comprises a P substrate guard ring.

12. The substrate isolation design of claim 9, further comprising at least a deep N well guard ring connecting to the N well guard ring.

13. A substrate isolation design, comprising:
a P substrate;
at least a device positioned in the substrate;
at least a P substrate guard ring surrounding the device; and
an N well guard ring positioned between the device and the P substrate guard ring,
wherein the P substrate guard ring is positioned beneath a shallow isolation trench.

14. The substrate isolation design of claim 13, further comprising at least a P+ guard ring positioned between the device and the P substrate guard ring.

15. The substrate isolation design of claim 14, wherein the N well guard ring is between the P+ guard ring and the P substrate guard ring.

16. The substrate isolation design of claim 15, further comprising at least a deep N well guard ring contacting to the N well guard ring.

17. The substrate isolation design of claim 13, further comprising at least a deep N well guard ring contacting to the N well guard ring.

* * * * *